(12) United States Patent
Chang et al.

(10) Patent No.: US 8,788,921 B2
(45) Date of Patent: Jul. 22, 2014

(54) DETECTOR WITH SOFT PRUNING

(75) Inventors: Wu Chang, Santa Clara, CA (US);
Victor Krachkovsky, Allentown, PA (US); Shaohua Yang, San Jose, CA (US); Haitao Xia, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 91 days.

(21) Appl. No.: 13/283,549

(22) Filed: Oct. 27, 2011

(65) Prior Publication Data
US 2013/0111306 A1    May 2, 2013

(51) Int. Cl.
*H03M 13/03*    (2006.01)

(52) U.S. Cl.
USPC .......................................................... 714/792

(58) Field of Classification Search
USPC .......................................................... 714/792
See application file for complete search history.

(56) References Cited

U.S. PATENT DOCUMENTS

| | | | |
|---|---|---|---|
| 5,214,672 A * | 5/1993 | Eyuboglu et al. | 375/254 |
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,424,881 A * | 6/1995 | Behrens et al. | 360/40 |
| 5,497,384 A * | 3/1996 | Fredrickson et al. | 714/792 |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,757,855 A * | 5/1998 | Strolle et al. | 375/262 |
| 5,802,069 A | 9/1998 | Coulson | |
| 5,802,118 A | 9/1998 | Bliss | |
| 5,844,945 A | 12/1998 | Nam | |
| 5,859,740 A * | 1/1999 | Takeda et al. | 360/77.02 |
| 5,898,710 A | 4/1999 | Amrany | |

(Continued)

FOREIGN PATENT DOCUMENTS

| EP | 467522 A2 * | 1/1992 |
|---|---|---|
| EP | 0549151 | 6/1993 |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Albert Decady
*Assistant Examiner* — Enam Ahmed
(74) *Attorney, Agent, or Firm* — Hamilton DeSanctis & Cha

(57) ABSTRACT

Various embodiments of the present invention provide apparatuses, systems and methods for data detection in a detector with soft pruning. For example, a data detector is disclosed that includes a branch metric calculator operable to calculate branch metrics for transitions between states in a trellis for the data detector, and a branch metric offset circuit operable to apply branch metric offsets to the branch metrics to yield soft pruned branch metrics. The branch metric offsets comprise a range of probability values from zero percent to one hundred percent.

20 Claims, 4 Drawing Sheets

(56) References Cited

U.S. PATENT DOCUMENTS

| | | | |
|---|---|---|---|
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccallister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,127,954 A * | 10/2000 | Kim | 341/95 |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,301,679 B1 | 10/2001 | Tan | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,446,236 B1 | 9/2002 | McEwen et al. | |
| 6,473,878 B1 | 10/2002 | Wei | |
| 6,535,553 B1 | 3/2003 | Limberg et al. | |
| 6,557,113 B1 | 4/2003 | Wallentine | |
| 6,625,775 B1 | 9/2003 | Kim | |
| 6,691,263 B2 | 2/2004 | Vasic et al. | |
| 6,697,977 B2 | 2/2004 | Ozaki | |
| 6,731,442 B2 | 5/2004 | Jin et al. | |
| 6,738,948 B2 | 5/2004 | Buckley et al. | |
| 6,757,862 B1 | 6/2004 | Marianetti, II | |
| 6,785,863 B2 | 8/2004 | Blankenship | |
| 6,810,502 B2 | 10/2004 | Eidson | |
| 6,901,119 B2 * | 5/2005 | Cideciyan et al. | 375/341 |
| 6,970,511 B1 | 11/2005 | Barnette | |
| 6,980,382 B2 | 12/2005 | Hirano et al. | |
| 6,986,098 B2 | 1/2006 | Poeppelman et al. | |
| 7,047,474 B2 | 5/2006 | Rhee | |
| 7,058,873 B2 | 6/2006 | Song | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,154,936 B2 | 12/2006 | Bjerke et al. | |
| 7,168,030 B2 | 1/2007 | Ariyoshi | |
| 7,184,486 B1 | 2/2007 | Wu | |
| 7,191,378 B2 | 3/2007 | Eroz | |
| 7,203,015 B2 | 4/2007 | Sakai et al. | |
| 7,203,887 B2 | 4/2007 | Eroz | |
| 7,237,173 B2 | 6/2007 | Morita et al. | |
| 7,254,192 B2 | 8/2007 | Onggosanusi | |
| 7,257,172 B2 | 8/2007 | Okamoto et al. | |
| 7,308,061 B1 | 12/2007 | Huang | |
| 7,310,768 B2 | 12/2007 | Eidson | |
| 7,313,750 B1 | 12/2007 | Feng | |
| 7,359,313 B2 | 4/2008 | Chan et al. | |
| 7,370,258 B2 | 5/2008 | Iancu | |
| 7,415,651 B2 | 8/2008 | Argon | |
| 7,441,174 B2 | 10/2008 | Li et al. | |
| 7,457,212 B2 | 11/2008 | Oh | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,646,829 B2 | 1/2010 | Ashley | |
| 7,652,966 B2 | 1/2010 | Kadokawa | |
| 7,675,987 B2 * | 3/2010 | Perrins | 375/265 |
| 7,688,915 B2 | 3/2010 | Tanrikulu et al. | |
| 7,702,973 B2 | 4/2010 | Mead | |
| 7,702,986 B2 | 4/2010 | Bjerke et al. | |
| 7,752,523 B1 | 7/2010 | Chaichanavong | |
| 7,779,325 B2 | 8/2010 | Song | |
| 7,802,172 B2 | 9/2010 | Casado | |
| 7,852,722 B2 | 12/2010 | Kikugawa et al. | |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,095,855 B2 | 1/2012 | Tan | |
| 8,161,357 B2 | 4/2012 | Tan | |
| 8,190,831 B2 | 5/2012 | Lee et al. | |
| 8,201,051 B2 | 6/2012 | Tan | |
| 8,209,584 B2 * | 6/2012 | Kim et al. | 714/755 |
| 8,237,597 B2 | 8/2012 | Liu | |
| 8,261,171 B2 | 9/2012 | Annampedu | |
| 8,291,284 B2 | 10/2012 | Savin | |
| 8,295,001 B2 | 10/2012 | Liu | |
| 2003/0043487 A1 | 3/2003 | Morita et al. | |
| 2007/0061687 A1 | 3/2007 | Hwang | |
| 2008/0002791 A1 * | 1/2008 | Gratrix et al. | 375/341 |
| 2008/0069373 A1 | 3/2008 | Jiang | |
| 2008/0304558 A1 | 12/2008 | Zhu et al. | |
| 2009/0132893 A1 | 5/2009 | Miyazaki | |
| 2009/0185643 A1 | 7/2009 | Fitzpatrick | |
| 2010/0042877 A1 | 2/2010 | Tan | |
| 2011/0167227 A1 | 7/2011 | Yang | |
| 2011/0264987 A1 | 10/2011 | Li | |
| 2012/0124118 A1 | 5/2012 | Ivkovic | |
| 2012/0182643 A1 | 7/2012 | Zhang | |
| 2012/0212849 A1 | 8/2012 | Xu | |
| 2012/0262814 A1 | 10/2012 | Li | |
| 2012/0265488 A1 | 10/2012 | Sun | |

FOREIGN PATENT DOCUMENTS

| | | |
|---|---|---|
| EP | 1096491 | 10/2005 |
| JP | 10-145243 | 5/1998 |
| JP | 2007-087529 | 4/2007 |
| WO | WO 01/39188 | 5/2001 |

OTHER PUBLICATIONS

Bagul, Y., G.: "Assessment of current health and remaining useful life of hard disk drives" [online] Jan. 1, 2009 [retrieved on Oct. 14, 2010] Retrieved from the internet: <URL; (http:iris.lib.neu.edu/comp_sys_eng_theses/I).

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

ECMA: Standardizing Information and Communication Systems: "Standard ECMA-272: 120 mm DVD Rewritable Disk (DVD-RAM)" Standard ECMA, . No. 272. Feb. 1, 1998 pp. 43-51.

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Galbraith et al., "Iterative Detection Read Channel Technology in Hard Disk Drives" [online] Oct. 1, 2008 [ret. on Oct. 1, 2008] Ret. from Internet:<URL:http://www.hitachigst.com.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kavcic et al., "A Signal-Dependent Autoregressive Channel Model", IEEE Transactions on Magnetics, vol. 35, No. 5, Sep. 1999 pp. 2316-2318.

(56) References Cited

OTHER PUBLICATIONS

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC IEEE Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al. "Hardware Implementation of GF($2^\wedge$m) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/269,852, filed Oct. 10, 2011 Unpublished (Haitao Xia).

U.S. Appl. No. 13/113,219, filed May 23, 2011 Unpublished (Yang Han).

U.S. Appl. No. 13/174,453, filed Jun. 30, 2011 Unpublished (Johnson Yen).

U.S. Appl. No. 13/174,537, filed Jun. 30, 2011 Unpublished (Anantha Raman Krishnan).

U.S. Appl. No. 13/227,416, filed Sep. 7, 2011 Unpublished (Lei Chen).

U.S. Appl. No. 13/180,495, filed Jul. 11, 2011 Unpublished (Chung-Li Wang).

U.S. Appl. No. 13/213,751, filed Aug. 19, 2011 Unpublished (Fan Zhang).

U.S. Appl. No. 13/186,234 filed Jul. 9, 2011 Unpublished (Haitao Xia).

U.S. Appl. No. 13/239,683, filed Sep. 22, 2011 Unpublished (Changyou Xu).

U.S. Appl. No. 13/259,832, filed Oct. 10, 2011 Unpublished (Haitao Xia).

U.S. Appl. No. 13/171,615, filed Jun. 29, 2011 Unpublished (Bradley D. Seago).

U.S. Appl. No. 13/227,544, filed Sep. 8, 2011 Unpublished (Shaohua Yang).

Vasic B., "High-Rate Girth-Eight Codes on Rectangular Integer Lattices", IEEE. Trans. Communications, vol. 52, Aug. 2004, pp. 1248-1252.

Vasic, B., "High-Rate Low-Density Parity-Check Codes Based on Anti-Pasch Affine Geometries," Proc. ICC 2002, pp. 1332-1336.

Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.

Yeo et al., "VLSI Architecture for Iterative Decoders in Magnetic Storage Channels", Mar. 2001, pp. 748-755, IEEE trans, Magnetics, vol. 37, No. 2.

Zhang et al., "Analysis of Verification-Based Decoding on the q-ary Symmetric Channel for Large q", IEEE Trans. on Information Theory, vol. 57, No. 10 (Oct. 2011).

Zhong et al., "Joint Code-Encoder Design for LDPC Coding System VLSI Implementation", ISCAS, IEEE pp. 389-392, May 2004.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

DETECTOR WITH SOFT PRUNING

BACKGROUND

Various products including hard disk drives utilize a read channel device to retrieve information from a medium and decode and convert the information to a digital data format. Such read channel devices may include data processing circuits including encoder, detector and decoder circuits to encode, detect and decode data as it is stored and retrieved from a medium or transmitted through a data channel, in order to reduce the likelihood of errors in the retrieved data.

It is important that the read channel devices be able to rapidly and accurately detect the data bits in retrieved or received data samples so they can be decoded. A number of various types of detectors are available to identify the value of encoded data bits as they are retrieved or received, before the detected data is decoded. One such detector is a maximum a posteriori (MAP) detector, which determines the most likely value of each encoded data bit. A typical MAP detector uses a trellis structure to calculate the probability or branch metric for each possible value of a bit or group of bits. A forward pass through the trellis is performed, calculating the probabilities of the possible values, a backward pass through the trellis is performed, again calculating the probabilities of the possible values, and the results of the forward and backward passes are combined to arrive at a decision based on the probabilities.

Because efforts are continually being made to increase the speed of data processing circuits while reducing their size and complexity, all while operating with increasingly dense storage devices or transmission channels that increase noise, there exists a need in the art for improving data detection in data processing circuits.

BRIEF SUMMARY

Various embodiments of the present invention provide apparatuses, systems and methods for data detection in a detector with soft pruning. For example, a data detector is disclosed that includes a branch metric calculator operable to calculate branch metrics for transitions between states in a trellis for the data detector, and a branch metric offset circuit operable to apply branch metric offsets to the branch metrics to yield soft pruned branch metrics. The branch metric offsets comprise a range of probability values from zero percent to one hundred percent. The branch metric offsets are applied in some embodiments to all transitions, including those from states that originate prohibited transitions and those from states that do not originate prohibited transitions. The branch metric offsets are derived in some instances from conditional state transition probabilities for encoded data at an input of the data detector based on at least one constraint on the encoded data. The soft pruning or application of branch metric offsets is disabled in some embodiments when constraints on encoded data are violated at the input to the data detector. In some cases, the branch metric offset circuit is operable to periodically switch between multiple sets of branch metric offsets. In cases in which the data detector is a maximum a posteriori detector, the branch metric offset circuit is operable to apply the branch metric offsets in a forward detection operation and in a reverse detection operation.

Other embodiments provide a method of detecting data in a data detector with soft pruning, including calculating a branch metric for each of a plurality of transitions between states in the data detector, applying a branch metric offset to each of the branch metrics to yield soft pruned branch metrics, and calculating hard decisions based on the soft pruned branch metrics. In some instances of the aforementioned embodiments, the branch metric offsets are applied to all transitions in the data detector. Some embodiments also include deriving the branch metric offsets from probabilities of data patterns at an input to the data detector by counting occurrences of each possible pattern in a sliding window applied to a data stream at an output of an encoder upstream of the data detector to yield probabilities of occurrence, grouping the possible patterns and normalizing the probabilities of occurrence by group. Some embodiments also include disabling the application of branch metric offsets when data at an input of the data detector violates constraints upon which the branch metric offsets are based.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
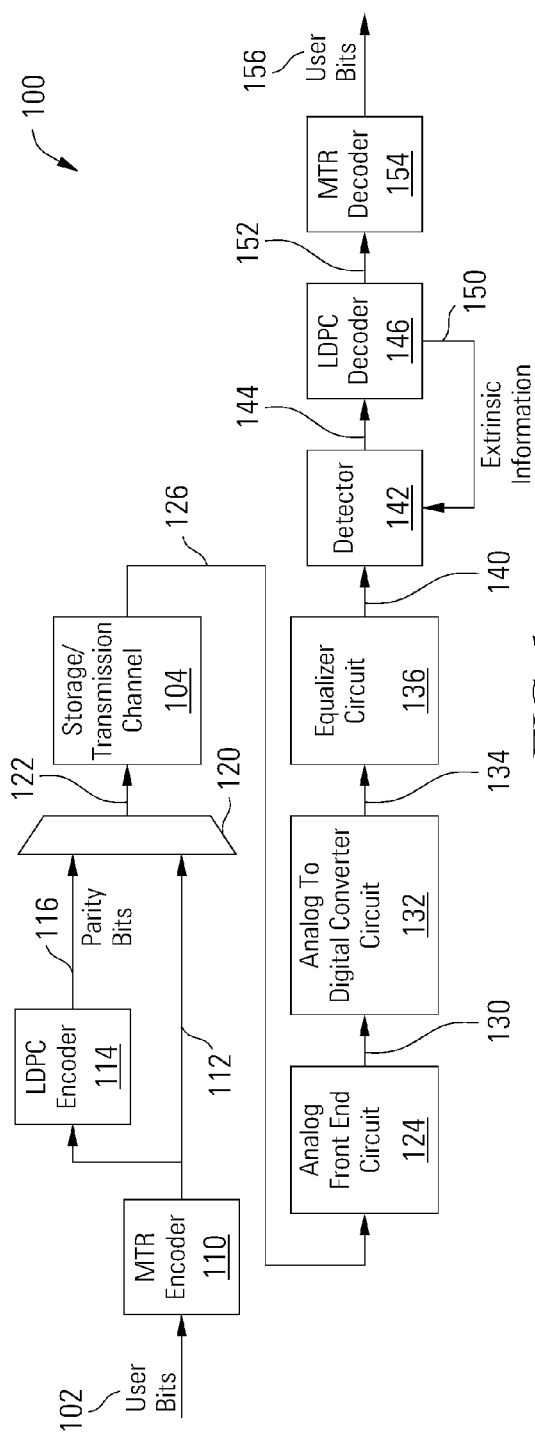
FIG. 1 depicts a block diagram of a read channel including a detector with soft pruning which may be used to store and retrieve or transmit and receive data in accordance with various embodiments of the present invention.

Various embodiments of the present invention are related to detectors with soft pruning and methods for data detection with soft pruning. The detector may comprise any channel detector or data detector which calculates branch metrics or probabilities for transitions between states relating to data bit values. The detector may comprise, but is not limited to, a maximum a posteriori (MAP) detector in which forward and backward recursions are performed in a trellis of data states. A trellis implemented by a detector with soft pruning can have any number of states, including a 2-state trellis that calculates transitions between single-bit values, or a 16-state trellis with four-bit values, or any other number of states.

In certain operating environments, the probability that data transitions take particular branches is affected by constraints imposed on the data by other data processing elements. For example, when the detector processes data encoded by a maximum transition run (MTR) encoder, some data patterns are prohibited by the constraints imposed by the MTR encoder. MTR encoders may be used in environments such as high density magnetic recording, in which long transition runs can cause significant burst errors. A first constraint that may be imposed by an MTR encoder is a J-constraint, which limits the number of consecutive transitions in a stream of data bits in the non-return to zero (NRZ) domain. An MTR(3) encoder limits the data stream to three consecutive bits of opposite state. The MTR(3) will not produce a stream of data bits with four consecutive different values. A second constraint that may be imposed is a K-constraint, which limits the DC length, i.e. the number of consecutive zeros or ones.

Constraints such as these affect the likelihood of certain branches or paths through the trellis in the detector. However, rather than simply removing branches through the trellis that are prohibited by setting their probability to zero, the detector with soft pruning takes into account the affect of data constraints on other branches through the trellis. This is performed in some embodiments by determining the affect on branch probabilities from the constraint to determine branch metric offsets, and applying the branch metric offsets to the branch metric calculations to generate conditional state transition probabilities during either or both the forward or backward recursions in the detector. The resulting soft pruned branch metrics or conditional state transition probabilities are thus modified to account for the affects of upstream constraints on the data being detected.

The soft pruning in the detector may also be adapted to compensate for other channel conditions that affect the channel data and the detection process. For example, the MTR constraints imposed by the encoder may be affected or violated by parity bits inserted after the encoding process or by other formatting data inserted into the encoded data such as parity bits, sync patterns, headers, etc. In some embodiments, the detector discontinues or modifies the soft pruning in response to these environmental conditions, for example turning off the soft pruning operation when processing parity bits or encoded bits adjacent parity bits where the MTR constraints that were used to generate the branch metric offsets are or may be violated.

Although the detector with soft pruning disclosed herein is not limited to any particular application, it may be used in a read channel of a storage device. Turning to FIG. 1, a read channel 100 is used to process user data bits 102, store them in or transit them through a storage or transmission channel 104 and retrieve the user data bits 106 without introducing errors. The user data bits 102 are processed in an MTR encoder 110, an enumerative encoder which limits maximum transition run length. The frequency response of the read channel 100 is generally at a maximum at DC and degrades near the Nyquist frequency, particularly when the storage or transmission channel 104 is a magnetic storage device. By limiting the maximum transition run length in the encoded user bits 112, the read channel 100 operates below the Nyquist frequency and avoids errors that might be introduced by the degraded frequency response near the Nyquist frequency.

The encoded user bits 112 are provided to a low density parity check (LDPC) encoder 114, which produces parity bits 116 for the encoded user bits 112. The parity bits 116 are combined with the encoded user bits 112 in a multiplexer 120. The resulting digital data stream 122 may be manipulated before storage or transmission in storage or transmission channel 104. For example, the digital data stream 122 may be converted to analog format and modulated or otherwise processed before it used to drive a magnetic write head or to be transmitted as a radio frequency signal or other wired or wireless signal.

The read channel 100 includes an analog front end circuit 124 that receives and processes an analog signal 126 from the storage or transmission channel 104. Analog front end circuit 124 may include, but is not limited to, an analog filter and an amplifier circuit as are known in the art. Based upon the disclosure provided herein, one of ordinary skill in the art will recognize a variety of circuitry that may be included as part of analog front end circuit 124. In some cases, the gain of a variable gain amplifier included as part of analog front circuit 124 may be modifiable, and the cutoff frequency and boost of an analog filter included in analog front end circuit 124 may be modifiable. Analog front end circuit 124 receives and processes the analog signal 126, and provides a processed analog signal 130 to an analog to digital converter circuit 132. In some cases, analog signal 126 is derived from a read/write head assembly in the storage or transmission channel 104 that is disposed in relation to a storage medium. In other cases, analog signal 126 is derived from a receiver circuit in the storage or transmission channel 104 that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog input 126 may be derived.

Analog to digital converter circuit 132 converts processed analog signal 130 into a corresponding series of digital samples 134. Analog to digital converter circuit 130 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 134 are provided to an equalizer circuit 136. Equalizer circuit 136 applies an equalization algorithm to digital samples 134 to yield an equalized output 140. In some embodiments of the present invention, equalizer circuit 136 is a digital finite impulse response filter circuit as are known in the art. Equalized output 140 is provided to a data detector circuit 142. In some cases, equalizer 136 includes sufficient memory to maintain one or more codewords until a data detector circuit 142 is available for processing.

The data detector circuit 142 performs a data detection process on the received input from the storage or transmission channel 104 resulting in a detected output 144. The detected output 144 is provided to a decoder such as an LDPC decoder 146 which performs parity checks on the detected output 144, ensuring that parity constraints established by the LDPC encoder 114 are satisfied in order to detect and correct any errors that may have occurred in the data while passing through the storage or transmission channel 104 or other components of the read channel 100. Other error detection and correction encoders and decoders may be used in the read channel 100 in place of the LDPC encoder 114 and LDPC decoder 146, and one of ordinary skill in the art will recognize a variety of error detection and correction encoders and decoders that may be used in relation to different embodiments of the present invention. In the case of the LDPC encoder 114 and LDPC decoder 146, the data detector circuit 142 and LDPC decoder 146 may operate in an iterative fashion, with extrinsic information 150 passed from the LDPC decoder 146 to the data detector circuit 142 to aid in the data detection and parity check process. The LDPC decoder 146 yields encoded user bits 152 retrieved from the storage or transmission channel 104, with the parity bits removed after the combination of encoded user bits and parity bits satisfy the parity check constraints.

The encoded user bits 152 from the LDPC decoder 146 are provided to an MTR decoder 154 which reverses the enumerative encoding performed by the MTR encoder 110. The MTR decoder 154 yields user data bits 156, which should be identical to user data bits 102 if the data is not corrupted in the storage or transmission channel 104 beyond the capacity of the data detector circuit 142 and LDPC decoder 146 to correct.

Data detector circuit 142 is operable to apply a data detection algorithm to a received codeword or data set, and in some cases data detector circuit 142 can process two or more codewords in parallel. The received codeword or data set includes a number of multi-bit symbols. In one particular embodiment of the present invention, the multi-bit symbols are four bit symbols that may take one of sixteen possible values for each four bit symbol (i.e., '0000', '0001', '0010', . . . '1111'). In such a case, a detected output 144 from data detector circuit 142 includes sixteen soft decision values (L0 corresponding to a likelihood that '0000' is the appropriate hard decision, L1 corresponding to a likelihood that '0001' is the appropriate hard decision, L2 corresponding to a likelihood that '0010' is the appropriate hard decision, and so on to L16 which corresponds to a likelihood that '1111' is the appropriate hard decision). In other embodiments of the present invention, the multi-bit symbols are two or three bit symbols or symbols of other widths. Based upon the disclosure provided herein, one of ordinary skill in the art will recognize a number of different symbol sizes that may be used in relation to different embodiments of the present invention.

In some embodiments of the present invention, data detector circuit 142 is a Viterbi algorithm data detector circuit as are known in the art. In other embodiments of the present invention, data detector circuit 142 is a maximum a posteriori data detector circuit as are known in the art. Of note, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 142 is started based upon availability of a data set from equalizer circuit 136 or other source.

An example MAP detector that may benefit from soft pruning implements the Bahl-Cocke-Jelinek-Raviv (BCJR) algorithm, performing forward and reverse recursions through a trellis of states, calculating the likelihood of each path between states in both the forward and reverse recursions, then combining the results. The MAP detector may yield a soft output, the likelihood of each bit or symbol, or may yield hard decisions, the value of each bit or symbol.

Figure 2:
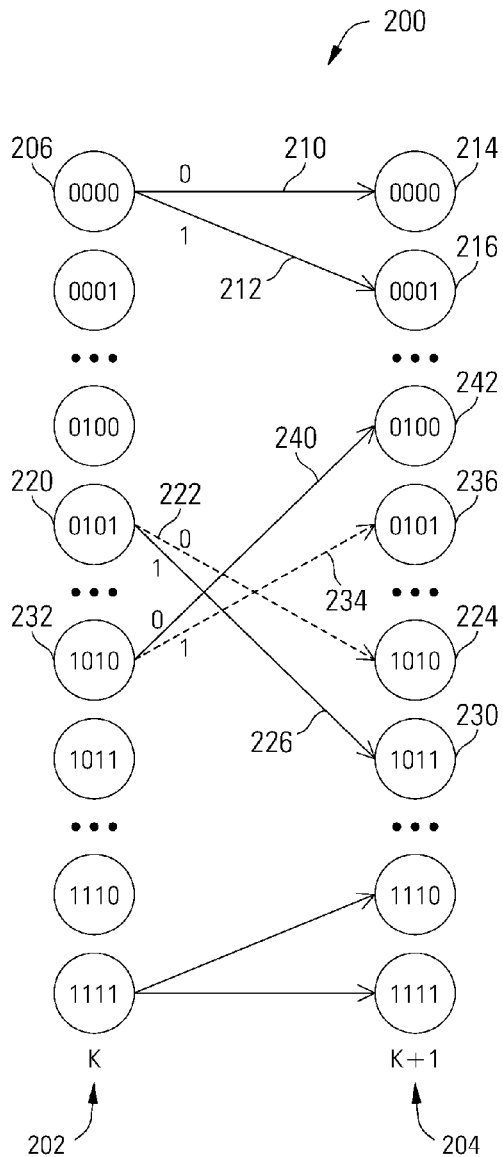
FIG. 2 depicts a trellis diagram illustrating branch metric probabilities in transitions between states in accordance with various embodiments of the present invention.

Turning to FIG. 2, a trellis diagram 200 is shown illustrating branch metric probabilities in transitions between states at time k 202 and time k+1 204. In the trellis diagram 200 of FIG. 2, at time k 202 illustrated in the left column, each state (e.g., 206) has a four bit value. (E.g., '0000') Between time k 202 and time k+1 204, another bit is received and is added to the right-most end of the value, with the left-most bit from time k 202 dropping off. For example, state 206 has two possible transitions 210 and 212. If a '0' bit is received, taking transition path 210, state 206 is followed by state 214, still with value '0000'. If a '1' bit is received, taking transition path 212, state 206 is followed by state 216 with value '0001'.

If the data processed by the detector is encoded by an MTR(3) encoder, certain data patterns are prohibited to limit the maximum transition run length and zero-run length. For example, from state 220 at time k having value '0101', the receipt of a '0' along transition path 222 would be a run of four consecutive transitions, '01010', which is prohibited and will not be produced by the MTR(3) encoder. Thus, the probability of transition 222 between states 220 and 224 is zero. As a result, the probability of receiving a '1' and taking transition 226 between states 220 and 230 with value '1011' is one, or one hundred percent. Similarly, from state 232 at time k with value '1010', the receipt of a '1' along transition path 234 would be a run of four consecutive transitions, '10101', which is prohibited and will not be produced by the MTR(3) encoder. Thus, the probability of transition 234 between state 232 at time k and state 236 is zero. As a result, the probability of receiving a '0' and taking transition 240 between states 232 and 242 with value '0100' is one, or one hundred percent.

Transitions 222 and 234 are pruned in the detector by calculating branch metric offsets and combining them with the branch metric calculations for transitions 222 and 234 that reduce the overall likelihood or probability for those transitions or branches to zero. The probabilities for transitions 226 and 240 are also modified by calculating and combining branch metric offsets for them that increase the overall likelihood or probability for those transitions or branches to one. Thus, the detector with soft pruning applies branch metric offsets for states associated with prohibited transitions. However, the changes in the probabilities for the transitions 222, 226, 234 and 240 also affect the probabilities for other transitions (e.g., 210 and 212) in the trellis. The detector with soft pruning also calculates and applies branch metric offsets for states not directly associated with prohibited transitions. In some embodiments, the detector with soft pruning calculates and applies branch metric offsets for all paths through the trellis, including all transitions. The manipulation of branch metrics in a data detector based on probability of input data patterns for transitions from states including those that do not originate prohibited transitions is referred to herein as soft pruning.

The probability of various input data patterns may be acquired in any of a number of suitable manners, including using calculations based on the theory of operation of components upstream from the detector and experimentally based on simulated or actual circuits. For example, in some embodiments, the probability of various input data patterns is acquired experimentally by monitoring the output of a data encoder upstream of the detector based on a large amount of input data. The data encoder may be considered as a black box for this purpose with a random data input. The encoder will produce a constraint sequence, a stream of output data that conforms to the encoder constraints, such as a limit on the maximum data transition run length. A sliding window is applied to the stream of output data, with the length of the sliding window set based on the symbol length of the data detector. For the example detector with a four-bit symbol disclosed above, a five-bit sliding window is applied to the stream of data used to acquire the probability distribution. As the data shifts through the sliding window bit by bit, a count is kept of how many times each particular sequence or pattern occurs in the data stream. Given a five-bit window, 32 different patterns are possible. The probability of occurrence of each of the 32 patterns in the data stream is calculated based on the counts.

The conditional state transition probability, or the probability that a particular four-bit state will transition to another particular four-bit state may then be calculated. Given a pair of states in the 32 patterns having the same four-bit prefix, it can be assumed that the pair of states are preceded in the trellis by the same state, having the four-bit sequence as the least significant four bits. The two transitions or branches from a particular four-bit state to two subsequent four-bit states are thus identified. The probability of the pair of states is normalized by scaling the probabilities of the each of the pair of states so their probabilities sums to 1. The resulting normalized probabilities of each of the pair of states with the same four-bit prefix is the conditional state transition probability applied to branch metrics in the trellis for the transitions to the two states. The branch metric offsets may thus correspond directly to the conditional state transition probabilities or may be derived from them.

Figure 3:
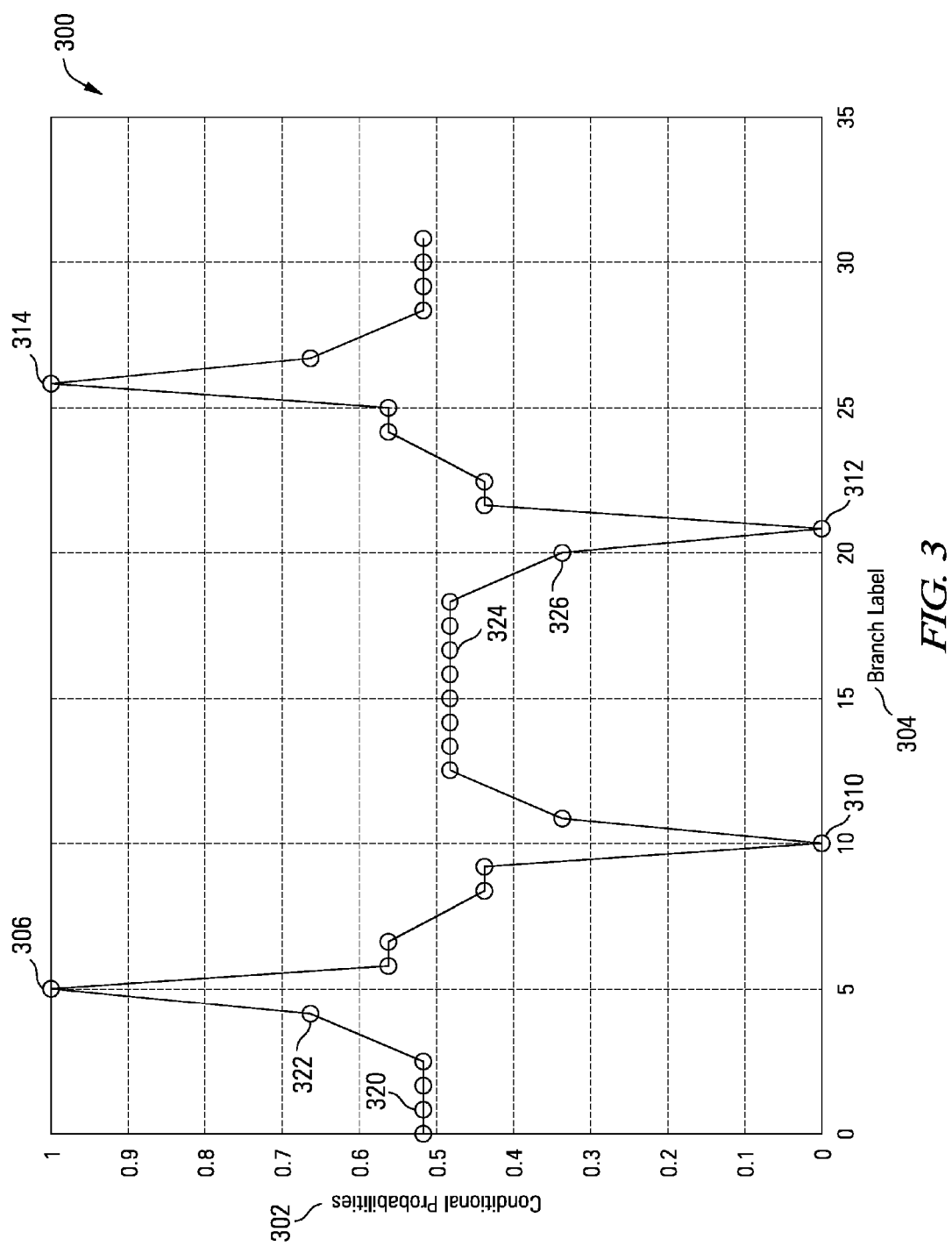
FIG. 3 depicts a plot of example conditional state transition probabilities for MTR(3) encoded data in accordance with various embodiments of the present invention.

A plot 300 of example conditional state transition probabilities for a particular MTR(3) encoder is illustrated in FIG. 3. For the 16 four-bit states in the trellis of FIG. 2, there are 32 branches or state transitions. The conditional state transition probabilities 302 are plotted for each of the 32 branch labels 304. The 32 branches are labeled in an arbitrary order for the plot 300 of FIG. 3. For example, the fifth branch label 306 corresponds with transition 226 from state 220 ('0101') to state 230 ('1011'), branch label 310 corresponds with transition 222 from state 220 ('0101') to state 224 ('1010'), branch label 312 corresponds with transition 234 from state 232 ('1010') to state 236 ('0101'), and branch label 314 corresponds with transition 240 from state 232 ('1010') to state 242 ('0100'). As disclosed above with respect to FIG. 2, some branches in the trellis of the detector have a higher conditional probability and some have a lower conditional probability based on the encoder or other components upstream from the detector. For example, with an MTR(3) encoder, the probabilities of transitions 226 and 240 (branch labels 306 and 314, respectively) are one, and the probabilities of transitions 222 and 234 (branch labels 310 and 312, respectively) are zero. Transitions from states 220 and 232 involve transitions from states that are directly associated with prohibited state transitions 222 and 234. As illustrated in plot 300 and disclosed above, transitions from states that do not originate prohibited transitions such as transitions 210 and 212 from state 206 ('0000') are also affected by conditional state transition probabilities. Transitions 210 and 212 would each have a probability of 50% in the absence of soft pruning, but as illustrated in FIG. 3, may have probabilities other than 50% with soft pruning. See, e.g., branch labels 320 and 322 with various probabilities greater than 50% but less than 100% and branch labels 324 and 326 with various probabilities less than 50% but greater than 0%. Again, the application of conditional state transition probabilities both to states (e.g., 206) that do not originate prohibited transitions and to states (e.g., 220, 232) that originate prohibited transitions (e.g., 222, 234) is referred to herein as soft pruning. Soft pruning also includes applying conditional state transition probabilities other than 0% and 100%, using more a more continuous range of probability values.

In some embodiments, multiple sets of conditional state transition probabilities may be applied periodically at different periods to enhance data detection with encoders having different probability properties at different periods. For example, in one example an encoder may be adapted to process an input data stream across 1000 time periods using two sets of conditional state transition probabilities, alternating between the two for each successive time period.

The conditional state transition probability may be denoted as $P(x_k|x_{k-4}^{k-1})$, with the log of the conditional state transition probabilities, $\log(P(x_k|x_{k-4}^{k-1}))$, added to each branch metric. This application of a conditional state transition probability for a transition due to a single bit change may be referred to as full rate soft pruning. In some embodiments, other soft pruning rates may be used. For example, quarter rate soft pruning may be applied for transitions due to four-bit changes. With a 16 state trellis, it may be assumed that the input sequence is a Markov source of order 4. In this case, the conditional state transition probability is denoted as $P(x_{k-3}^{k}|s_{k-4})$, where $P(x_{k-3}^{k}|s_{k-4})=P(x_{k-3}^{k}|x_{k-7}^{k-4})=\Pi_{i=-3}^{0}P(x_{k+i}|x_{k-4+i}^{k-1+i})$, which provides four one-bit terms. The logs of the four one-bit terms are added to each branch metric.

In some embodiments of a data detector, the full rate branch metric is proportional to the negative log of the Gaussian distribution and is set forth as $\text{branchMetric}_k(x_{k-4}^{k})=\text{beta}\cdot\{(z_k[C]-\text{edgemean}(x_{k-4}^{k}))^2/2 \text{ var}-\ln(P(x_k|x_{k-4}^{k-1}))-\ln(s[C])\}$, where $\ln(P(x_k|x_{k-4}^{k-1}))$ is the natural log of the conditional state transition probability. In some cases, the calculation of the branch metric in the detector is simplified to $\text{branchMetric}_k(x_{k-4}^{k})=\text{sqterm}(x_{k-4}^{k})+\log\text{ term}[C]$, where $\text{sqterm}(x_{k-4}^{k})=(z_k[C]-\text{edgemean}(x_{k-4}^{k}))^2/8$, and $\log\text{ term}[C]=-\ln(s[C])$. In these cases, the sqterm is changed by soft pruning to $\text{sqterm}(x_{k-4}^{k})=(z_k[C]-\text{edgemean}(x_{k-4}^{k}))^2-2\text{ var}*\ln(P(x_k|x_{k-4}^{k-1}))/8$. Alternatively, the logterm may be changed to $$\log \text{term}[C] = -\frac{\text{var}}{4} * \ln(s[C]).$$

Figure 4:
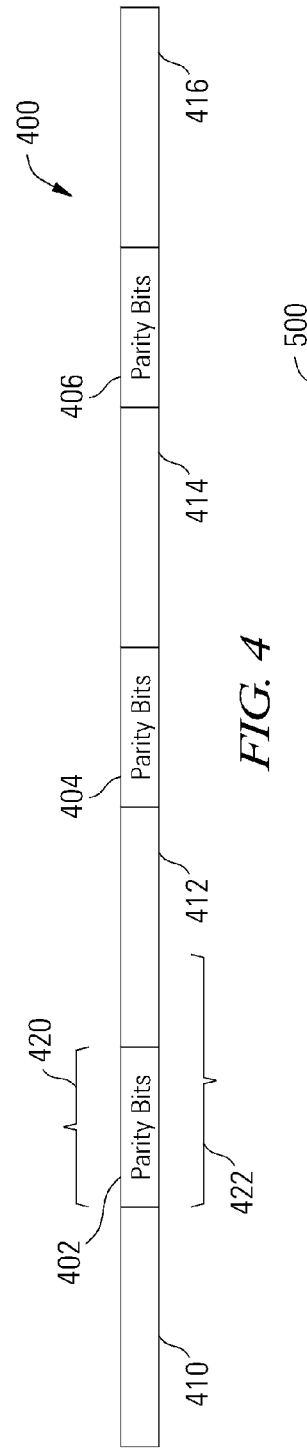
FIG. 4 depicts a diagram of encoded user bits and parity bits in accordance with various embodiments of the present invention.

The soft pruning may be selectively activated and deactivated in a data detector based on the content or format of the incoming data. Turning back to FIG. 1, although the conditional state transition probabilities may be based on a single component such as the MTR encoder 110 or upon a single mode of operation in a read channel 100, these conditional state transition probabilities may be affected by other components or modes of operation, such as the parity bits 116 generated by LDPC encoder 114 and inserted in the encoded user bits 112 by multiplexer 120. A sequence 400 of encoded user bits 112 and parity bits 116 is illustrated in FIG. 4, with blocks 402, 404 and 406 of parity bits 116 inserted between blocks 410, 412, 414 and 416 of encoded user bits 112. (The proportional width of blocks 410, 412, 414 and 416 of encoded user bits 112 to 402, 404 and 406 of parity bits 116 is arbitrary in FIG. 4 and may be exaggerated for clarity.) In some embodiments, the conditional state transition probabilities are based on the distribution of various patterns in the encoded user bits 112 and do not apply to the parity bits 116. In other words, the parity bits 116 do not conform to the constraints of the MTR encoder 110 and may contain transition runs longer than three. In order to provide the best data detection in the data detector circuit 142, the soft pruning may be disabled during periods when the constraints giving rise to the conditional state transition probabilities are violated. This may not be limited to the period 420 of the parity bit block 402, but may also extend to a wider period 422 before and/or after the parity bit block 402, depending on whether the detector processes combinations of encoded user bits 112 and parity bits 116. In one embodiment, soft pruning is disabled for a period 422 including the parity chunk and also j+1 bits after the chunk. Given a J-constraint of 3, the period 422 extends 4 bits beyond the block 402 of parity bits to prevent soft pruning with branch metrics which do not apply to the combination of parity bits 116 with encoded user bits 112.

The distribution of parity bits 116 in the encoded user bits 112 is thus a balance, with larger and more infrequent blocks of parity bits enabling more soft pruning but increasing the possibility of K-constraint violations which negatively affect timing loops. In some embodiments, the width of the parity bit blocks (e.g., 402) is kept small enough to meet K-constraints, but substantially as large as possible within the K-constraints to reduce limiting soft pruning.

Other data mixed with encoded user bits 112 may also interfere with the conditional state transition probabilities, such as sync marks and boundary bits such as sector preambles and end of sector padding. Soft pruning is disabled in some embodiments at least during these sections of data as disclosed above with respect to parity bits.

Figure 5:
FIG. 5 depicts a block diagram of a data detector with soft pruning in accordance with various embodiments of the present invention.

Turning to FIG. 5, a block diagram of a data detector 500 is illustrated. Again, the data detector 500 is not limited to any particular architecture and may comprise a MAP detector, a Viterbi detector, a maximum likelihood detector or any other that calculates branch metrics. Some embodiments include a branch metric calculator 502, branch metric offsets 504 and a memory 506. For example, in a MAP detector, the branch metric calculator 502 calculates branch metrics in forward and backward processing operations and storing branch metrics in memory 506 for use in calculating hard decisions. The branch metric offsets 504 are combined with the branch metrics calculated by the branch metric calculator 502, for example by adding them in the log domain either inside the branch metric calculator 502 or in an external adder (not shown). The branch metric offsets 504 may comprise a branch metric offset circuit that applies branch metric offsets to branch metrics, for example by adding them in the log domain. The architecture of the branch metric calculator 502 is dependent on the type of detector. Based upon the disclosure provided herein, one of ordinary skill in the art will recognize a variety of circuitry that may be included as part of branch metric calculator 502, such as look up tables, multiplexers, comparators and selectors.

Figure 6:
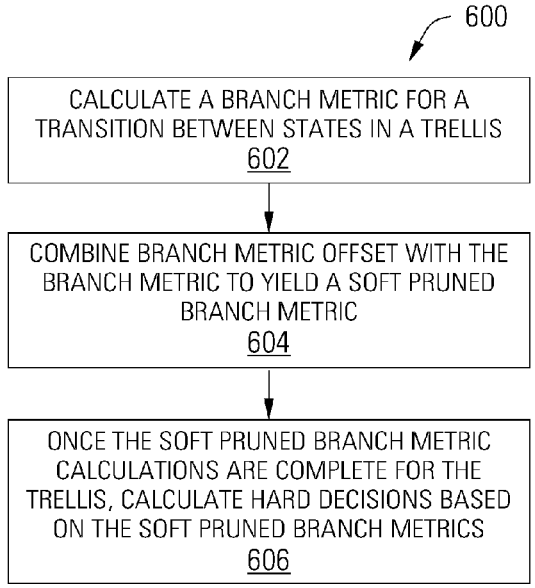
FIG. 6 depicts a flow diagram showing a method for data detection with soft pruning in accordance with various embodiments of the present invention.

Turning to FIG. 6, a flow diagram 600 shows a method for data detection with soft pruning in accordance with some embodiments of the present invention. Following flow diagram 600, a branch metric is calculated for a transition between states in a trellis (Block 602), and a branch metric offset is combined with the branch metric to yield soft pruned branch metrics. (Block 604) The branch metric offsets may be applied during the branch metric calculations in some embodiments as each branch metric is calculated. In some cases, different sets of branch metric offsets are applied periodically at different times along the trellis. Once the soft pruned branch metric calculations are complete for the trellis, hard decisions are calculated based on the soft pruned branch metrics. (Block 606) The symbol values for states in the trellis are not limited to any particular value, and may be, for example, one-bit values in a two-state trellis or four-bit values in a sixteen-state trellis. The length of the trellis is also not limited to any particular value or time length. The branch metric calculations and offsets may be performed in one pass or in multiple iterations, such as in the forward and backward pass of a MAP detector.

Figure 7:
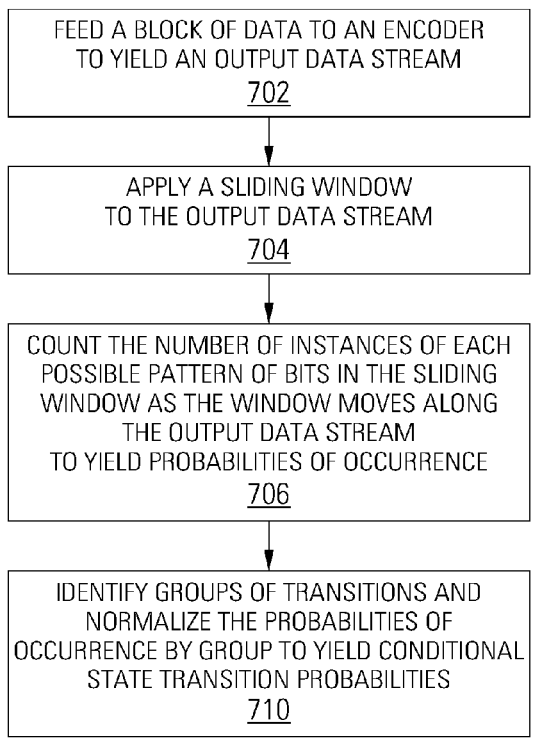
FIG. 7 depicts a flow diagram showing a method for obtaining conditional state transition probabilities from an encoder for use in data detection with soft pruning in accordance with various embodiments of the present invention.

Turning to FIG. 7, a flow diagram 700 shows a method for obtaining conditional state transition probabilities from an encoder that may be used as branch metric offsets or from which branch metric offsets may be derived. Again, the data detector with soft pruning is not limited to any particular source of conditional state transition probabilities. A block of data is fed to the encoder to yield an output data stream. (Block 702) A sliding window is applied to the output data stream. (Block 704) The width of the sliding window may be, for example, one bit greater than the symbol width in the trellis of the detector in which branch metric offsets are applied. For a four-bit symbol, a five-bit sliding window may be used. The number of instances of each possible pattern of bits in the sliding window is counted as the window moves along the output data stream to yield probabilities of occurrence. (Block 706) Groups of transitions are identified and the probabilities of occurrence are normalized by group to yield conditional state transition probabilities. (Block 710) For example, the two possible transitions from a single four-bit state may be identified by identifying two five-bit patterns with the same four-bit prefix, and the probabilities of occurrence for the two five-bit patterns are normalized to sum to 1.

Figure 8:
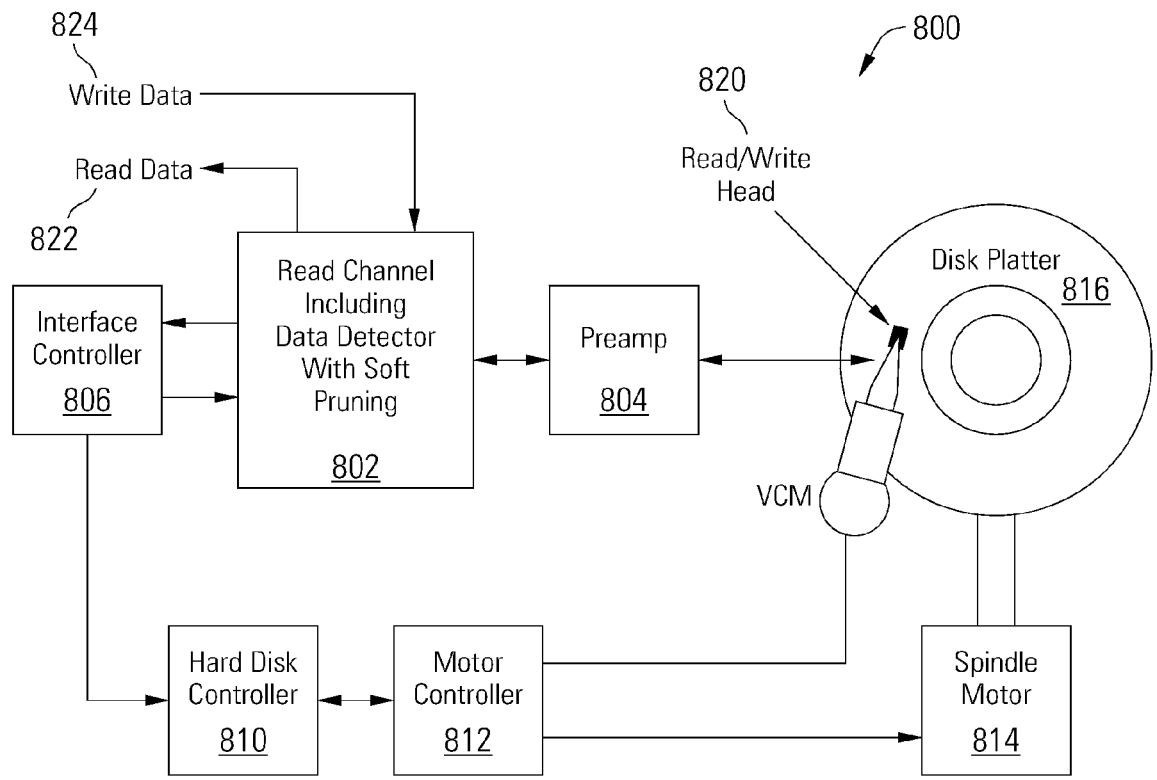
FIG. 8 depicts a storage system including a detector with soft pruning in accordance with some embodiments of the present invention.
Figure 9:
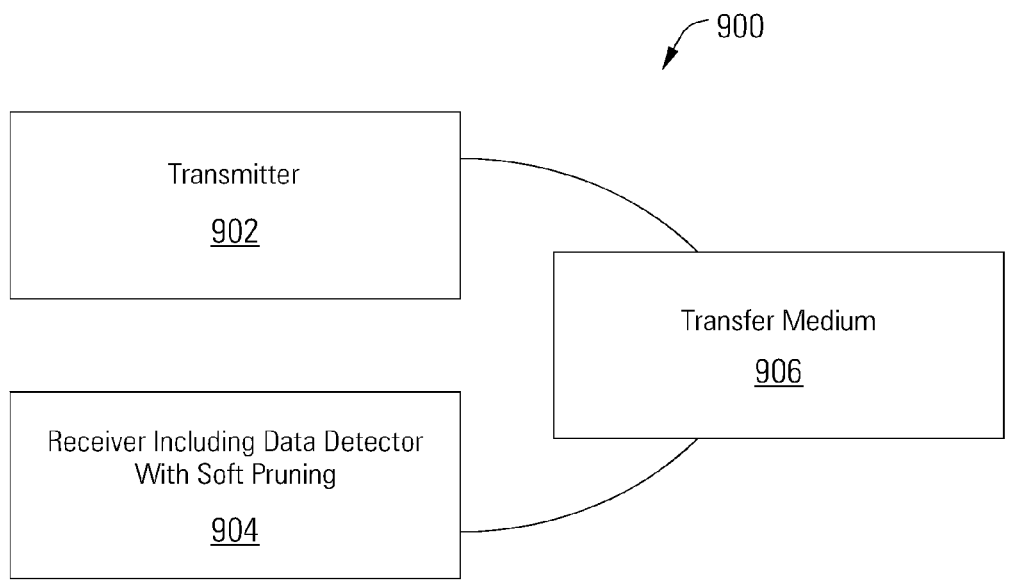
FIG. 9 depicts a wireless communication system including a detector with soft pruning in accordance with some embodiments of the present invention.

Although the data detector with soft pruning disclosed herein is not limited to any particular application, several examples of applications are presented in FIGS. 8 and 9 that benefit from embodiments of the present invention. Turning to FIG. 8, a storage system 800 is illustrated as an example application of a data detector with soft pruning in accordance with some embodiments of the present invention. The storage system 800 includes a read channel circuit 802 with a data detector with soft pruning in accordance with some embodiments of the present invention. Storage system 800 may be, for example, a hard disk drive. Storage system 800 also includes a preamplifier 804, an interface controller 806, a hard disk controller 810, a motor controller 812, a spindle motor 814, a disk platter 816, and a read/write head assembly 820. Interface controller 806 controls addressing and timing of data to/from disk platter 816. The data on disk platter 816 consists of groups of magnetic signals that may be detected by read/write head assembly 820 when the assembly is properly positioned over disk platter 816. In one embodiment, disk platter 816 includes magnetic signals recorded in accordance with either a longitudinal or a perpendicular recording scheme.

In a typical read operation, read/write head assembly 820 is accurately positioned by motor controller 812 over a desired data track on disk platter 816. Motor controller 812 both positions read/write head assembly 820 in relation to disk platter 816 and drives spindle motor 814 by moving read/write head assembly 820 to the proper data track on disk platter 816 under the direction of hard disk controller 810. Spindle motor 814 spins disk platter 816 at a determined spin rate (RPMs). Once read/write head assembly 820 is positioned adjacent the proper data track, magnetic signals representing data on disk platter 816 are sensed by read/write head assembly 820 as disk platter 816 is rotated by spindle motor 814. The sensed magnetic signals are provided as a continuous, minute analog signal representative of the magnetic data on disk platter 816. This minute analog signal is transferred from read/write head assembly 820 to read channel circuit 802 via preamplifier 804. Preamplifier 804 is operable to amplify the minute analog signals accessed from disk platter 816. In turn, read channel circuit 802 decodes and digitizes the received analog signal to recreate the information originally written to disk platter 816. This data is provided as read data 822 to a receiving circuit. As part of processing the received information, read channel circuit 802 performs a data detection process on the received signal using a data detector with soft pruning. Such a data detector with soft pruning may be implemented consistent with the disclosure above in relation to FIGS. 2-3 and 5. In some cases, the data detection may be performed consistent with the flow diagrams disclosed above in relation to FIGS. 6 and 7. A write operation is substantially the opposite of the preceding read operation with write data 824 being provided to read channel circuit 802 and written to disk platter 816.

It should be noted that storage system 800 may be integrated into a larger storage system such as, for example, a RAID (redundant array of inexpensive disks or redundant array of independent disks) based storage system. It should also be noted that various functions or blocks of storage system 800 may be implemented in either software or firmware, while other functions or blocks are implemented in hardware.

Turning to FIG. 9, a wireless communication system 900 or data transmission device including a transmitter 902 and receiver 904 with a data detector with soft pruning is shown in accordance with some embodiments of the present invention. Communication system 900 includes a transmitter 902 that is operable to transmit encoded information via a transfer medium 906 as is known in the art. The encoded data is received from transfer medium 906 by receiver 904. Receiver 904 incorporates a data detector with soft pruning. Such a data detector with soft pruning may be implemented consistent with that described above in relation to FIGS. 2-3 and 5. In some cases, the data detection in receiver 904 may be done consistent with the flow diagrams in FIGS. 6 and 7.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses, systems, and methods for data detection in a data detector with soft pruning. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data detector comprising:
    a branch metric calculator operable to calculate branch metrics for transitions between states in a trellis for the data detector; and
    a branch metric offset circuit operable to apply branch metric offsets to the branch metrics to yield soft pruned branch metrics, wherein the branch metric offsets comprise a range of probability values from zero percent to one hundred percent, wherein a first group of the states originate at least one transition prohibited by the branch metric offsets and wherein a second group of the states do not originate transitions prohibited by the branch metric offsets, and wherein the branch metric offset circuit is operable to apply the branch metric offsets to the branch metrics for the transitions from the first group of states and to the branch metrics for the transitions from the second group of states.

2. The data detector of claim 1, wherein the branch metric offsets are derived from conditional state transition probabilities for encoded data at an input of the data detector based on at least one constraint on the encoded data.

3. The data detector of claim 2, wherein the branch metric offset circuit is operable to apply the branch metric offsets by adding them to the branch metrics in a log domain.

4. The data detector of claim 2, wherein the branch metric offset circuit is operable to disable soft pruning by not applying the branch metric offsets when the at least one constraint is violated.

5. The data detector of claim 1, wherein the branch metric offset circuit is operable to periodically switch between applying the branch metric offsets and applying a second group of branch metric offsets.

6. The data detector of claim 1, wherein the data detector comprises a maximum a posteriori detector, and wherein the branch metric offset circuit is operable to apply the branch metric offsets in a forward detection operation and in a reverse detection operation.

7. The data detector of claim 1, wherein the branch metric calculator and the branch metric offset circuit are implemented as an integrated circuit.

8. The data detector of claim 1, wherein the branch metric calculator and the branch metric offset circuit are incorporated in a storage device.

9. The data detector of claim 1, wherein the branch metric calculator and the branch metric offset circuit are incorporated in a transmission device.

10. A method of detecting data in a data detector with soft pruning, comprising:
    calculating a branch metric for each of a plurality of transitions between states in the data detector;
    deriving branch metric offsets from probabilities of data patterns at an input to the data detector, wherein the branch metric offsets are derived by counting occurrences of each possible pattern in a sliding window applied to a data stream at an output of an encoder upstream of the data detector to yield probabilities of occurrence;
    applying at least one of the branch metrics offset to each of the branch metrics to yield soft pruned branch metrics; and
    calculating hard decisions based on the soft pruned branch metrics.

11. The method of claim 10, wherein the branch metric offsets are applied to all transitions in the data detector.

12. The method of claim 10, wherein the branch metric offsets are further derived by grouping the possible patterns and normalizing the probabilities of occurrence by group.

13. The method of claim 10, further comprising disabling the application of branch metric offsets when data at an input of the data detector violates constraints upon which the branch metric offsets are based.

14. The method of claim 10, wherein the branch metric offsets lie in a probability range between and including zero percent and one hundred percent.

15. A storage system comprising:
a storage medium maintaining a data set;
a read/write head assembly operable to write the data set to the storage medium and to read the data set from the storage medium;
a maximum transition run encoder operable to encode the data set to yield encoded data before it is written to the storage medium and to limit a number of successive transitions in the encoded data; and
a data detector operable to detect values of the encoded data using branch metrics for transitions between states in a trellis and to apply branch metric offsets to all the transitions, wherein the branch metric offsets are based on probabilities of occurrence in data patterns in the encoded data, and wherein the data detector is operable to stop applying the branch metric offsets when data at an input of the data detector violates the limit on the number of successive transitions.

16. The storage system of claim 15, wherein the probabilities of occurrence lie in a probability range between and including zero percent and one hundred percent.

17. The method of claim 10, further comprising periodically switching between applying the branch metric offsets and applying a second group of branch metric offsets to each of the branch metrics to yield the soft pruned branch metrics.

18. The method of claim 10, wherein the branch metric offsets are derived from conditional state transition probabilities for encoded data at an input of the data detector based on at least one constraint on the encoded data.

19. The storage system of claim 15, wherein the data detector comprises a maximum a posteriori detector operable to apply the branch metric offsets in a forward detection operation and in a reverse detection operation.

20. The storage system of claim 15, wherein the data detector is operable to apply the branch metric offsets by adding them to the branch metrics in a log domain.

* * * * *